(12) United States Patent
Kinyua et al.

(10) Patent No.: US 12,231,137 B2
(45) Date of Patent: *Feb. 18, 2025

(54) HYBRID ANALOG-TO-DIGITAL CONVERTER WITH INVERTER-BASED RESIDUE AMPLIFIER

(71) Applicant: Taiwan Semiconductor Manufacturing Co., Ltd., Hsin-Chu (TW)

(72) Inventors: Martin Kinyua, Cedar Park, TX (US); Eric Soenen, Austin, TX (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/231,745

(22) Filed: Aug. 8, 2023

(65) Prior Publication Data

US 2023/0412179 A1 Dec. 21, 2023

Related U.S. Application Data

(63) Continuation of application No. 17/718,157, filed on Apr. 11, 2022, now Pat. No. 11,770,125, which is a continuation of application No. 17/146,056, filed on Jan. 11, 2021, now Pat. No. 11,329,659.

(60) Provisional application No. 62/981,668, filed on Feb. 26, 2020.

(51) Int. Cl.
*H03M 1/06* (2006.01)

(52) U.S. Cl.
CPC ................. *H03M 1/0602* (2013.01)

(58) Field of Classification Search
CPC ....... H03M 1/145; H03M 1/462; H03M 1/468
See application file for complete search history.

(56) References Cited

U.S. PATENT DOCUMENTS

| | | | | |
|---|---|---|---|---|
| 7,382,305 | B1 * | 6/2008 | Murden | G05F 1/575 |
| | | | | 327/539 |
| 9,998,131 | B1 * | 6/2018 | Kinyua | H03F 3/45237 |
| 10,103,742 | B1 * | 10/2018 | Guo | H03M 1/145 |
| 10,181,860 | B1 * | 1/2019 | Patil | H03M 1/145 |

(Continued)

OTHER PUBLICATIONS

Yang, Wenhua, et al. "A 3-V 340-mW 14-b 75-Msample/s CMOS ADC with 85-db SFDR at Nyqyuist input." IEEE Journal of Solid-Slate Circuits 36.12 (2001): 1931-1936. ISSN: 00189200. DOI: 10.1109/4.972143.

(Continued)

*Primary Examiner* — Lam T Mai
(74) *Attorney, Agent, or Firm* — Duane Morris LLP (57) ABSTRACT

An apparatus and method for analog to digital conversion of analog input signals are disclosed herein. In some embodiments, an analog-to-digital (ADC) may comprise: a first successive approximation register (SAR) circuit comprising a fast SAR (FSAR) circuit and a residue digital-to-analog converter (RDAC) circuit and a residue amplifier circuit, coupled to the RDAC circuit, comprising an amplifier circuit that is configured to amplify a residual signal generated by the RDAC circuit, wherein the amplifier circuit comprises a deadzone control circuit and a first, second and third inverter stages, wherein the third stage is biased to operate in a sub-threshold region.

20 Claims, 7 Drawing Sheets

(56) References Cited

U.S. PATENT DOCUMENTS

| | | | | |
|---|---|---|---|---|
| 10,868,557 B2* | 12/2020 | Kinyua | ............... | H03M 1/0612 |
| 11,095,301 B1* | 8/2021 | Tang | ................... | H03M 1/1014 |
| 11,329,659 B2* | 5/2022 | Kinyua | ............... | H03M 1/0602 |
| 11,770,125 B2* | 9/2023 | Kinyua | ................. | H03M 1/145 |
| | | | | 341/161 |
| 2010/0156692 A1* | 6/2010 | Jeon | ...................... | H03M 1/164 |
| | | | | 341/162 |
| 2012/0229313 A1* | 9/2012 | Sin | ...................... | H03M 1/1225 |
| | | | | 341/110 |
| 2013/0002467 A1* | 1/2013 | Wang | .................... | H03M 1/145 |
| | | | | 341/172 |
| 2013/0106630 A1* | 5/2013 | Wong | ...................... | H03M 1/46 |
| | | | | 341/110 |
| 2015/0091746 A1* | 4/2015 | Wang | ................. | H03M 1/1245 |
| | | | | 341/161 |
| 2018/0083647 A1* | 3/2018 | Yoshioka | ............. | H03M 1/466 |
| 2019/0245546 A1* | 8/2019 | Wu | ........................ | H03K 19/20 |
| 2020/0136639 A1* | 4/2020 | Kinyua | ............... | H03M 1/1245 |
| 2021/0175893 A1* | 6/2021 | Danial | .................. | H03M 1/181 |
| 2021/0234549 A1* | 7/2021 | Kinyua | ................. | H03F 3/3028 |
| 2021/0266001 A1* | 8/2021 | Kinyua | ............... | H03M 1/0602 |
| 2022/0239302 A1* | 7/2022 | Kinyua | ................... | H03F 3/303 |
| 2022/0360276 A1* | 11/2022 | Kinyua | ................. | H03F 3/4565 |
| 2023/0396263 A1* | 12/2023 | Kinyua | ................. | H03M 1/468 |
| 2023/0412179 A1* | 12/2023 | Kinyua | ................. | H03M 1/145 |

OTHER PUBLICATIONS

M. Kinyua and E. Soenen, "A 72.6 dB SNDR 14b 100 MSPS Ring Amplifier Based Pipelined Sar Adc with Dynamic2 Deadzone Control in 16 nm CMOS," 2020 IEEE Custom Integrated Circuits Conference (CICC), Boston, MA, USA, 2020, pp. 1-4, doi: 10.1109/CICC48029.2020.9075921.

* cited by examiner

HYBRID ANALOG-TO-DIGITAL CONVERTER WITH INVERTER-BASED RESIDUE AMPLIFIER

CROSS-REFERENCE TO RELATED APPLICATIONS

This application is a continuation of U.S. patent application Ser. No. 17/718,157, filed Apr. 11, 2022, which is a continuation of U.S. patent application Ser. No. 17/146,056, filed on Jan. 11, 2021, which claims priority to U.S. Provisional Patent Application No. 62/981,668, filed on Feb. 26, 2020, each of which is incorporated by reference herein in its entirety.

BACKGROUND

An analog-to-digital converter (ADC) is a circuit element that converts an analog signal to digital data. For example, digital data can include a number of different digital codes, and each of the digital codes can correspond to a unique voltage or current level of the analog signal. Analog-to-digital converter (ADC) has various architectures, for example, flash analog-to-digital converters (flash ADC), pipeline analog-to-digital converters (pipeline ADC), and successive approximation register analog-to-digital converters (SAR ADC), all of which have their respective application fields. For example, flash ADC is typically the fastest in terms of number of samples per second, but has the highest implementation cost. SAR ADC has a much lower implementation cost, however, it is considerably slower than flash ADC. Moreover, the small input signal linearity of the SAR ADC is limited. As to the pipelined ADC, it does not benefit from the technology scaling because the use of low voltage supplies gives rise to an augmented consumption of power. In addition, existing pipelined ADC architectures use high gain traditional Class-A amplifiers, which are very difficult to implement in a FinFET process Furthermore, the existing ADC architectures have a low signal to noise ratio (SNR) and a limited conversion bandwidth in low voltage deep sub-micron processes. In view of the deficiency of above analog-to-digital converters, there is a need to provide an ADC with advantage of high dynamic range SNR (SNDR) and large conversion bandwidth with low power consumption, while scalable to deep sub-micron process technologies.

The information disclosed in this Background section is intended only to provide context for various embodiments of the invention described below and, therefore, this Background section may include information that is not necessarily prior art information (i.e., information that is already known to a person of ordinary skill in the art). Thus, work of the presently named inventors, to the extent the work is described in this background section, as well as aspects of the description that may not otherwise qualify as prior art at the time of filing, are neither expressly nor impliedly admitted as prior art against the present disclosure.

BRIEF DESCRIPTION OF THE DRAWINGS

Various exemplary embodiments of the present disclosure are described in detail below with reference to the following Figures. The drawings are provided for purposes of illustration only and merely depict exemplary embodiments of the present disclosure to facilitate the reader's understanding of the present disclosure. Therefore, the drawings should not be considered limiting of the breadth, scope, or applicability of the present disclosure. It should be noted that for clarity and ease of illustration these drawings are not necessarily drawn to scale.

FIG. 3 illustrates an exemplary timing diagrams of operational phases described in Table 1, in accordance with some embodiments of the present disclosure.

DETAILED DESCRIPTION

Various exemplary embodiments of the present disclosure are described below with reference to the accompanying figures to enable a person of ordinary skill in the art to make and use the present disclosure. As would be apparent to those of ordinary skill in the art, after reading the present disclosure, various changes or modifications to the examples described herein can be made without departing from the scope of the present disclosure. Thus, the present disclosure is not limited to the exemplary embodiments and applications described and illustrated herein. Additionally, the specific order and/or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise.

Figure 1:
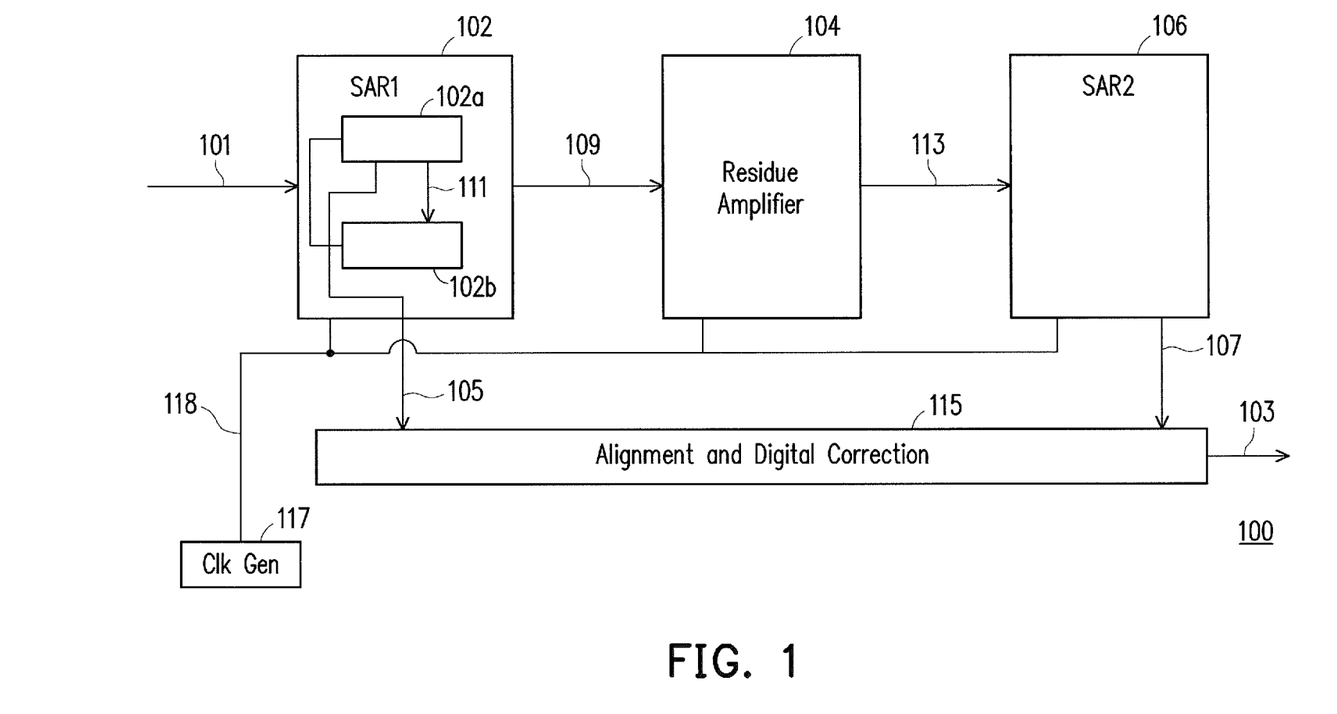
FIG. 1 illustrates an exemplary circuit diagram of a hybrid analog-to-digital converter (ADC), in accordance with some embodiments of the present disclosure.

FIG. 1 illustrates an exemplary block diagram of a hybrid ADC 100 according to some embodiments. As shown in FIG. 1, the hybrid ADC 100 includes a first successive approximation register (SAR) circuit 102, a residue amplifier (RA) circuit 104, a second SAR circuit 106, a digital error correction circuit 115, and a control logic circuit 117. In some embodiments, the RA circuit 104 may have a gain of 16. In other embodiments, the RA circuit 104 may have a gain of 32. Each of the blocks 102, 104, 106, 115, and 117 may include one or more circuits that each performs a respective function, which will be discussed in further detail below.

In some embodiments, the hybrid ADC 100 converts an analog input signal (e.g., an analog voltage signal) 101 to a digital output signal 103 representative of the analog input signal 101 in a digital format. As such, the digital output signal 103 obtained based on a first digital signal 105 output by the first SAR circuit 102 and a second digital signal 107 output by the second SAR circuit 106, may be output by the error correction circuit 115. In some embodiments, the digital signal 107 may be a 9-bit digital code. Moreover, by using the first SAR circuit 102, the RA circuit 104, and the second SAR circuit 106 to perform respective functions of three sequential phases in a pipelined fashion, the digital signals 105 and 107 can be respectively generated. More specifically, the first SAR circuit 102 may be configured to implement a binary search algorithm to determine digital values of the first digital signal 105. The digital values of the first digital signal 105 correspond to the analog input signal 101 for the plurality of most significant bits (MSB). In some embodiments, the digital signal 105 may be a 6-bit digital code. The first SAR circuit 102 is also configured to generate a residue voltage 109. The residue voltage 109 corresponds to a difference in voltage value between the analog input voltage 101 and the first digital signal 105.

As shown in FIG. 1, the error correction circuit 115 may be configured to combine the digital signals 105 and 107 to generate the digital output signal 103. In some embodiments, the control logic circuit 117, coupled to the first SAR circuit 102, the RA circuit 104, and the second SAR circuit 106, may be configured to control which function each of the first SAR circuit 102, the RA circuit 104, and the second SAR circuit 106 is configured to perform in each phase. In some embodiments, the control logic circuit 117 may include a clock generator configured to generate clock signals 118. In other embodiments, the clock signals 118 may control operation of the hybrid ADC 100. For example, the clock signals 118 may control the timing of phases $\Phi_1$, $\Phi_2$, and $\Phi_3$. General operations of the hybrid ADC 100 will be described below in conjunction with Table 1.

TABLE 1

| Phase | First SAR Circuit 102 | Residue Amplifier Circuit 104 | Second SAR Circuit 106 |
|---|---|---|---|
| $\Phi_1$ | Sample current analog input signal in both FSAR and RDAC | Residue amplifier disabled; Common-mode sense capacitors re-charged; Deadzone Control Disabled | Idle/Convert residue of previous analog input signal using both $\Phi_1$ and $\Phi_2$ phases |
| $\Phi_2$ | A/D conversion of the current input signal | Auto-Zero; Deadzone Control Disabled | Idle/Convert residue of previous analog input signal using both $\Phi_1$ and $\Phi_2$ phases |
| $\Phi_3$ | Hold residual signal of the current analog input signal using RDAC | Amplify residual signal of the current analog input signal; Deadzone control enabled | Sample amplified residual signal of the current analog input signal |

In some embodiments, the control logic may initialize the hybrid ADC 100 to receive a first analog input signal 101. In some embodiments, the control logic circuit 117 of the hybrid ADC 100 controls the timing of the first SAR circuit 102, the RA circuit 104, and the second SAR circuit 106. In various embodiments, the control logic circuit 117 may be configured to control the respective operations of phase $\Phi_1$ as specified in Table 1 above. For example, in phase $\Phi_1$, the first SAR circuit 102 may be configured to sample the first analog input signal 101; the RA circuit 104 is configured to be disabled; and the second SAR circuit 106 is configured to be in an idle mode. The term "sample," as used herein, refers to an operation for extracting an analog value from a continuous and time-varying signal at a specific time.

After the first SAR circuit 102 finishes sampling the first analog input signal 101, the control logic circuit 117 controls the first SAR circuit 102, the RA circuit 104, and the second SAR circuit 106 to perform the operations of phase $\Phi_2$ as indicated in Table 1 above. For example, in phase $\Phi_2$, the first SAR circuit 102 is configured to convert the sampled first analog input signal 101 into the first digital signal 105 that, in some embodiments, corresponds to a most-significant-bits (MSB) portion of the digital output signal 103, and further provides the residual voltage signal 109. As the digital values for the first digital signal 105 are determined by the first SAR circuit 102, the quantized voltage of the first digital signal 105 converges to the analog input signal 101, and the residue voltage signal 109 decreases. Moreover, in phase $\Phi_2$ the RA circuit 104 is configured to transition to an "auto-zero" mode that is configured to clear out an input offset, if any, present at input ends of the RA circuit 104, which causes the RA circuit 104 to be ready to perform amplification, while the second SAR circuit 106 is still configured to be in the idle mode.

After phase $\Phi_2$ the residual voltage signal 109 is provided to the RA circuit 122, the control logic circuit 182 controls the first SAR circuit 102, the RA circuit 104, and the second SAR circuit 106 to perform the operations of phase $\Phi_3$ as specified in Table 1 above. In phase $\Phi_3$, the first SAR circuit 102 is configured to hold the residual voltage signal 109 using a residual digital-to-analog converter (RDAC) implemented in the first SAR circuit 102; the RA circuit 104 is configured to amplify the residual voltage signal 109 so as to provide an amplified residual voltage signal 113 to the second SAR circuit 106; and the second SAR circuit 106 is configured to sample the amplified residual voltage signal 111. The three main functional circuits (102, 104, and 106) referenced in FIG. 1 each performs a respective function in one of three sequential phases (in time). Alternatively stated, in accordance with some embodiments, the first SAR circuit, the RA circuit, and the second SAR circuit operate as a pipelined circuit and each performs a respective function in a certain phase during operations of such a pipelined hybrid ADC.

In some embodiments, the hybrid ADC 100 may be configured to operate through a second iteration. As such, during the second iteration the hybrid ADC 100 may receive a second input signal. Subsequently, the hybrid ADC 100 may transition to operate in phase $\Phi_1$ so that the first SAR circuit 102 can sample the second input signal, while the RA circuit 104 is again disabled. During phases $\Phi_1$ and $\Phi_2$ of the second iteration, the second SAR circuit 106 may be configured to convert already sampled amplified residual voltage signal 109 that was part of the previously received analog input signal 101 in phase $\Phi_3$ of the first iteration. In some embodiments, the second SAR circuit 106 is configured to convert the amplified residual voltage signal 113 into the digital signal 107 that corresponds to a least-significant-bits (LSB) portion of the digital output signal 103.

During the second iteration, similar to the first iteration, after the first SAR circuit 102 samples the second analog input signal, the hybrid ADC 100 proceeds to perform operations in phase $\Phi_2$ with respect to the second analog input signal. In some embodiments, in phase $\Phi_2$ of the second iteration, the first SAR circuit 102 converts the sampled second analog input signal and further provides a residual voltage signal to the RA circuit 104. Once the digital 105 and 107 signals are provided to the error correction circuit 115 (e.g., after phase 2 of the second iteration), the error correction circuit 115 is configured to perform error correction on the digital signals 105 and 107, and then provide the digital output signal 103.

Figure 2:
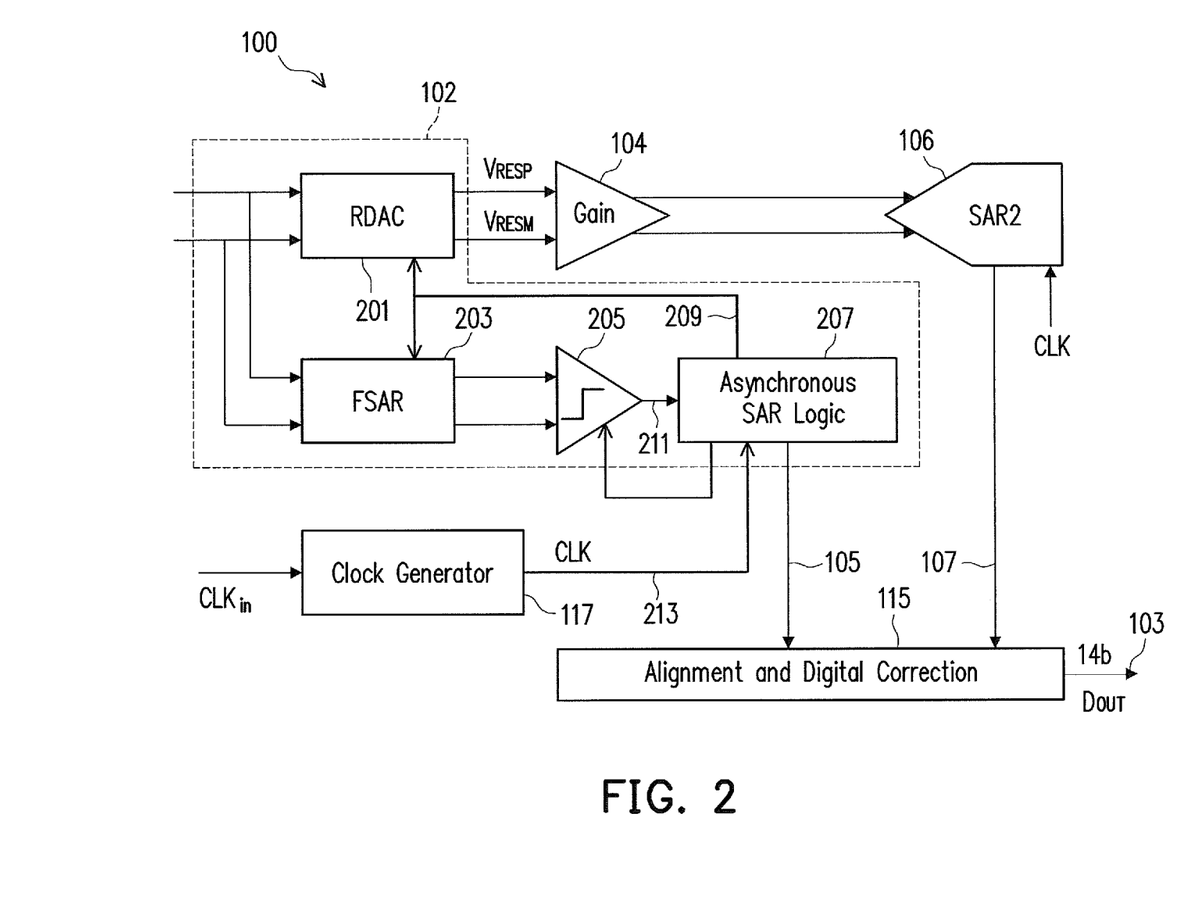
FIG. 2 illustrates an exemplary circuit diagram of the hybrid ADC, in accordance with some embodiments of the present disclosure

FIG. 2 illustrates an exemplary circuit diagram of the hybrid ADC 100. As shown in FIG. 2, the first SAR circuit 102 includes a fast SAR (FSAR) 203 and a residue digital-to-analog converter (RDAC) 201, a comparator 205, and an asynchronous SAR logic circuit 207. Although in the illustrated embodiments of FIG. 2, the RDAC 201 and FSAR 203 are implemented as a fully-differential circuits, it is noted that the RDAC 201 and FSAR 203 may be implemented by any of a variety of configurations, while remaining within the scope of the present disclosure. For example, the FSAR 203 may include a single-ended SAR ADC, and the RDAC 201 may include a single-ended SAR DAC.

In some embodiments, during a current iteration, the FSAR 203 and RDAC 201 may be configured to concurrently receive and sample an analog input signal (e.g., 101) in phase $\Phi_1$ of the current iteration. As such, this enables the RDAC 201 and the FSAR 203 to decouple the high-speed path (ADC) from the noise-limited path (RDAC). This configuration allows for improved speed and power dissipation. In phase $\Phi_2$ of the current iteration, the FSAR 203 may be configured to perform a successive approximation register (SAR) technique on the analog input signal (e.g., 101). The MSBs of the converted analog input signal (e.g., 101) may then be fed to the RDAC 201 to generate the residue voltage 109. In some embodiments, the FSAR 203 may utilize minimum size capacitors to enable fast SAR iterations with low energy consumption.

In some embodiments, the FSAR 203 may be coupled to the comparator 205 that includes inverting and non-inverting input terminals and may be configured to compare voltage levels at its input terminals. Moreover, the asynchronous SAR logic circuit 207 may be coupled to the comparator 205 and further configured to sequentially provide a plurality of SAR feedback control signals 209 based on a plurality of sequentially provided comparison results 211 (outputs of the comparator 205). In some embodiments, the sequential provisions of the SAR control signals 209 may be provided based on a clock signal 213 received by the asynchronous SAR logic circuit 207 from the control logic circuit 117. In some embodiments, the SAR control signals 209 provided by the SAR logic circuit 207 may be asynchronous. As such, the asynchronous SAR control signals 209 obviate the need to explicitly generate a high speed clock. In alternative embodiments, the control logic circuit 117 may include a clock generator as shown in the exemplary embodiments of FIG. 2.

In some embodiments, the first digital signal 105 output by the first SAR circuit 102 may comprise of 6 bits and a second digital signal 107 output by the second SAR circuit 106 may comprise of 9 bits. In further embodiments, the RA circuit 104 may exhibit a residual gain of 16. In some embodiments, the first SAR circuit 102 may be operated by a 1.2 V supply, which enables a 2.4 $V_{pk-pk}$ (pick-to-pick) voltage swing for the input signal (e.g., 101).

In some embodiments, the RA circuit 104 may be operated by a 0.75 V supply, while utilizing core transistors (e.g., transistors having minimum dimensions compared to input/output (I/O) transistors which have large channel width/length (W/L) rations), which provide low power consumption and improve the operating bandwidth of the hybrid ADC 100 due their a large transit frequency $F_t$ and a large transconductance to drain current ratio ($g_m/I_d$) compared to I/O transistors. In further embodiments, the RA circuit 104 may be operated by a supply voltage less than 1 V.

Figure 3:
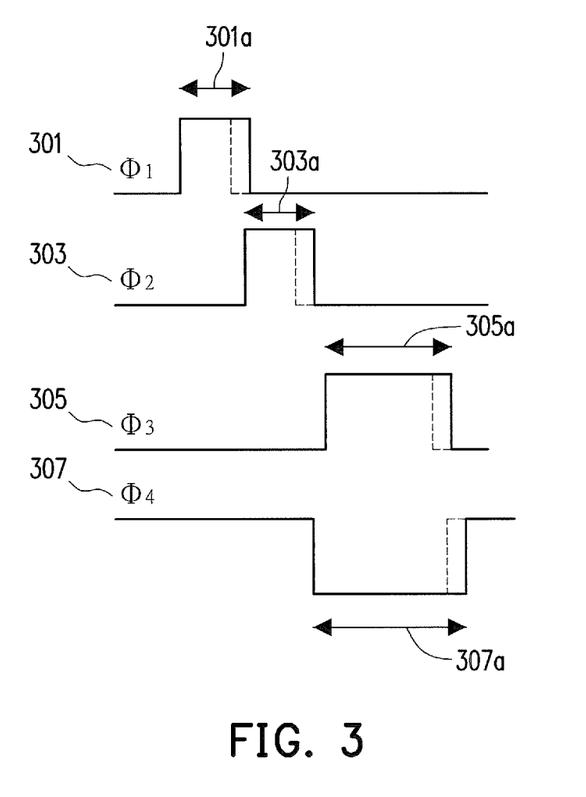
FIG. 3 illustrates timing signals for operational phases $\Phi_1$, $\Phi_2$, $\Phi_3$, and $\Phi_4$, in accordance with some embodiments.

FIG. 3 illustrates a timing diagram of the pipelined hybrid ADC 100 operations, in accordance with some embodiments. In some embodiments, the first SAR circuit 102 is responsive to the rising edge of a signal $\Phi_1$. During a high period 301 of the signal $\Phi_1$, the first SAR circuit 102 may be sampling the first analog input signal 101, while the RA circuit 104 is disabled. In some embodiments, the high period 301 may have a predetermined width. The rising edge of a signal $\Phi_2$ may signal start of phase $\Phi_2$. During a high period 303 of the signal $\Phi_2$, the first SAR circuit 102 may be configured to convert the sampled first analog input signal 101 into the first digital signal 105; the RA circuit 104 may be configured to transition to an "auto-zero" mode and the second SAR circuit 106 may in the idle mode. In some embodiments, the high period 303 may have a predetermined width. The rising edge of a signal $\Phi_2$ may signal start of phase $\Phi_3$. During a high period 305 of the signal $\Phi_3$, the first SAR circuit 102 may be configured to hold the residual voltage signal 109, the RA circuit 104 may be configured to amplify the residual voltage signal 109, and the second SAR circuit 106 may be configured to sample the amplified residual voltage signal 111. In some embodiments, the high period 305 may have a predetermined width. In further embodiments, the signals $\Phi_1$, $\Phi_2$, and $\Phi_3$ may be non-overlapping and can be generated by the control logic circuit 117. In further embodiments, a signal $\Phi_4$ may be provided that is low during the high period of the signal $\Phi_3$. In some embodiments, during the high periods of the signal $\Phi_4$, the RA circuit 104 may be coupled to a common mode voltage. In further embodiments, a low period 307 of the signal $\Phi_4$ may have a predetermined width.

Figure 4:
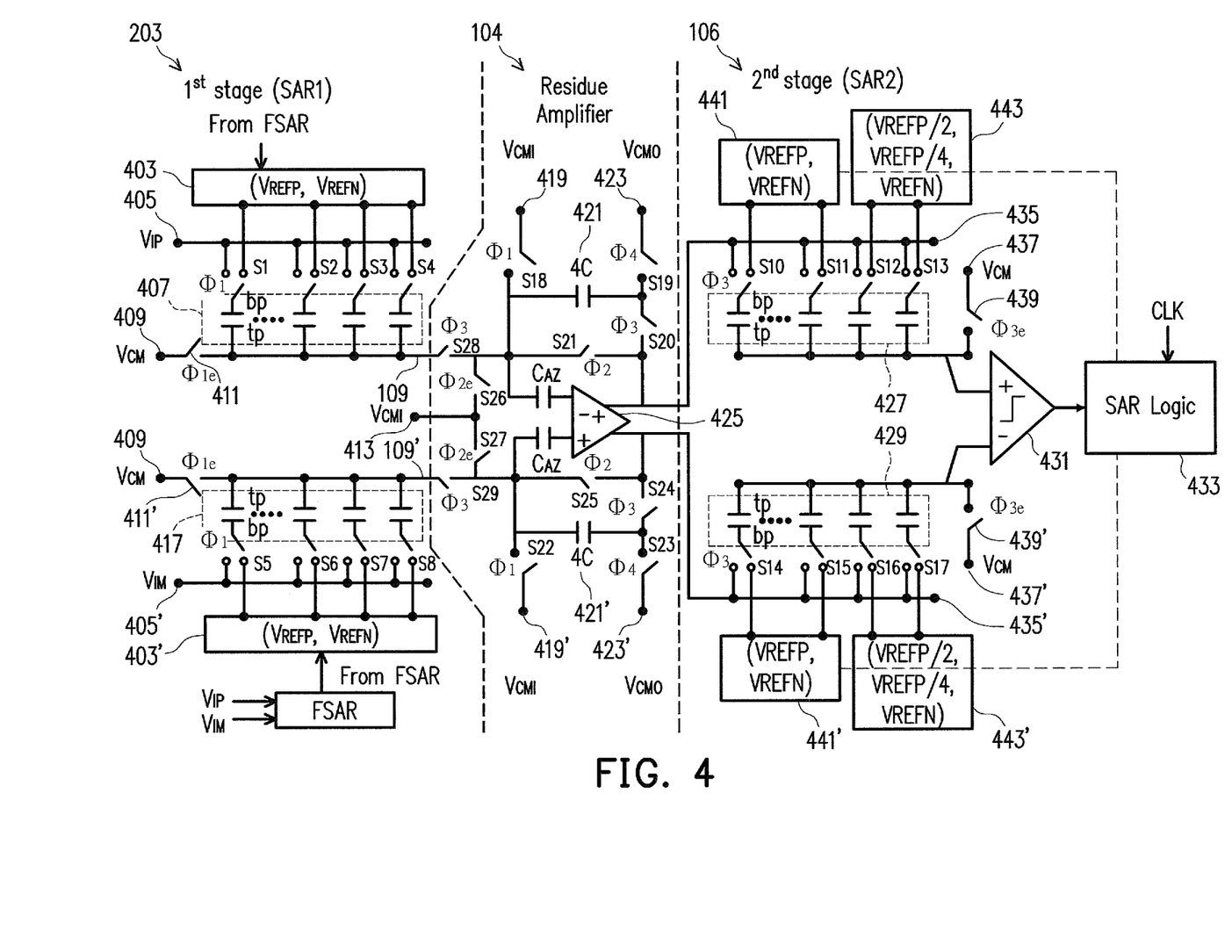
FIG. 4 illustrates a schematic diagram of a residual digital-to-analog converter (RDAC), a residual amplifier (RA) circuit, and a successive approximation register (SAR) circuit coupled to the RA circuit, in accordance with some embodiments

FIG. 4 illustrates a schematic diagram of the RDAC 203, the RA circuit 104, and the second SAR circuit 106, in accordance with some embodiments. As shown in FIG. 4, the RDAC 203 includes a first capacitor array 407 that the includes a plurality of capacitors, a second capacitor array 417 that the includes a plurality of capacitors, a plurality of bit switches $S_1$, $S_2$, $S_3$, $S_4$, $S_5$, $S_6$, $S_7$, $S_8$, and switches 411 and 411'. In some embodiments, each capacitor of the first and second capacitor arrays 407 and 417 has a top conductive plate (tp) and a bottom conductive plate (bp), as shown in FIG. 4. The tp's of the capacitors in the first capacitor array 407 are each coupled to a common voltage 409 through the switch 411 (when the switch 411 is turned on during the phase $\Phi_1$); and the bp's of the capacitors in the first capacitor array 407 are each selectively coupled to either a node 403 or a node 405 based on a switching behavior of the respectively coupled bit switch ($S_1$, $S_2$, $S_3$, or $S_4$). Further, in some embodiments, the node 403 is coupled to either the negative or positive reference voltage supplied from the FSAR 203. And the node 405 is coupled to the one end (e.g., $V_{IP}$) of the differential analog input signal 101.

Similarly, the tp's of the capacitors in the second capacitor array 417 are each coupled to the common voltage 409 through the switch 411' (when the switch 411' is turned on); and the bp's of the capacitors in the second capacitor array 417 are each selectively coupled to either a node 403' or a node 405' based on a switching behavior of the respectively coupled bit switch ($S_5$, $S_6$, $S_7$, or $S_8$). Further, in some embodiments, the node 403' is coupled to either the negative or positive reference voltage supplied from the FSAR 203. And the node 405' is coupled to the another end (e.g., $V_{IM}$) of the differential analog input signal 101.

In some embodiments, capacitances of the capacitors in the first capacitor array 407 are weighted with respect to one another. For example, if the minimum capacitance is C then the capacitors in the first capacitor array 407 may have capacitance of 2×C, 4×C, 8×C, 16×C. In further embodiments, a respective capacitance of each additional capacitor the first capacitor array 407 may be selected as: 2N×C, wherein N is an integer larger than 3. Capacitances of the capacitors in the second capacitor array 417 may be selected in similar fashion. In some embodiments, the total capacitance in the first capacitor array 407 (or the second capacitor array 407) is about 2.0 picofarad (pF), which provides low thermal noise. Moreover, the RDAC 203 capacitors in both first and second capacitor arrays 407 and 417 are sized for low-noise residue generation as determined by the "kT/C" thermal noise specification. Therefore, no additional energy is wasted on SAR bit iterations using large, noise limited capacitors in both first and second capacitor arrays 407 and 417.

In some embodiments, the switching behavior of each of the bit switches ($S_1$, $S_2$, $S_3$, $S_4$, $S_5$, $S_6$, $S_7$, and $S_8$) is controlled by the signal $\Phi_1$ that is provided by the asynchronous SAR logic circuit 207 of the first SAR circuit 102 (also shown in FIG. 2). And the switching behavior of each of the switches 411 and 411' is concurrently determined according to the operation mode of the first SAR circuit 102 (e.g., phases $\Phi_1$, $\Phi_2$, or $\Phi_3$), which may also be determined by the control logic circuit 117 (FIG. 1).

The RDAC 203, illustrated in FIG. 4, may also be configured to provide the residual voltage signal 109 to the RA circuit 102 of the hybrid ADC 100. In further embodiments, similar to the analog input signal 101, the residual voltage signal 109 may be provided, by the RDAC 203, as differential signals 109 (in-phase) and 109' (out-of-phase). In some embodiments, the RA circuit 102 may include a differential amplifier 425 having auto-zeroing capacitors $C_{AZ}$ coupled to its differential inputs as shown in FIG. 4. In various embodiments, the auto-zeroing capacitors $C_{AZ}$ may functions as an offset sampling and auto-zeroing capacitors and may be coupled to the output of the first SAR circuit 203. In some embodiments, during the phase $\Phi_1$ the auto-zeroing capacitors $C_{AZ}$ may be connected to common nodes 419/419' through switches $S_{18}$ and $S_{22}$, which are closed when the signal $\Phi_1$ is high. The common nodes 419/419' may be coupled to a common voltage reference $V_{CMI}$. During phase $\Phi_2$, the RA circuit 104 is configured to transition to the "auto-zero" mode. In the "auto-zero" mode, switches $S_{27}$ and $S_{26}$ may be closed to connect the auto-zeroing capacitors $C_{AZ}$ to a common node voltage reference 413 (e.g., $V_{CMI}$). In some embodiments, the voltage reference nodes 413 and 419/419' may have the same voltage. As a result, the voltage at the output of the amplifier 425 should still be relatively small. Moreover, in phase $\Phi_2$, switches $S_{21}$ and $S_{25}$ are closed, therefore, creating a feedback loop connecting the output of the amplifier 425 to the auto-zeroing capacitors $C_{AZ}$ and cancelling input offset of the amplifier 425.

Moreover, the RA circuit shown in FIG. 4 may also include feedback capacitors 421 and 421' that each have one of its terminal connected to the output of the amplifier 425 and the other terminal connected to one the auto-zeroing capacitors $C_{AZ}$. During phase $\Phi_3$, the residual voltage signal 109/109' may be received at the auto-zeroing capacitors $C_{AZ}$ when the switches $S_{29}$ and $S_{28}$ are closed. Furthermore, during phase $\Phi_3$, switches $S_{20}$ and $S_{24}$ may be closed to connect the output of the amplifier 425 to the auto-zeroing capacitors $C_{AZ}$ via the feedback capacitors 421 and 421'. In some embodiments, the feedback capacitors 421 and 421' may be connected to a reference voltage node 423 and 423', respectively, during phases $\Phi_1$ and $\Phi_2$. More specifically, switches $S_{19}$ and $S_{23}$ may be closed during phase $\Phi_4$.

Furthermore, as shown in FIG. 4, the second SAR circuit 106 coupled to the RA circuit 102 may include a comparator 431, a first capacitor array 427 that includes a plurality of capacitors, a second capacitor array 429 that includes a plurality of capacitors, bit switches $S_{10}$, $S_{11}$, $S_{12}$, $S_{13}$, $S_{14}$, $S_{15}$, $S_{16}$, $S_{17}$, an SAR logic circuit 433, and switches 439 and 439'. Each capacitor of the first and second capacitor arrays 427 and 429 is coupled to a respective bit switch at its respective conductive bottom plate (bp), which will be discussed below. As such, a number of the bit switches corresponds to a number of the capacitors in the first/second capacitor array (427/429). Although only four capacitors are shown in the first/second capacitor array (427/429), it is noted that any desired number of capacitors may be included in the first/second capacitor array (427/429), and a corresponding number of bit switches ($S_{10}$ to $S_{13}$ and $S_{14}$ to $S_{17}$, etc.) may be included in the second SAR circuit 106 while remaining within the scope of the present disclosure.

In some embodiments, each capacitor of the first and second capacitor arrays 427 and 429 has a top conductive plate (tp) and a bottom conductive plate (bp), as shown in FIG. 4. More specifically, the tp's of each capacitors in the first capacitor array 427 are each coupled to a non-inverting input terminal of the comparator 431, and also to a common voltage 437 (e.g., $V_{CM}$) through the switch 439 (when the switch 439 is turned on during phase $\Phi_3$); and the bp's of the capacitors in the first capacitor array 427 are each selectively coupled to either a node 435 or nodes 441/443 based on a switching behavior of the respectively coupled bit switch ($S_{10}$, $S_{11}$, $S_{12}$, and $S_{13}$). Further, in some embodiments, the node 435 is coupled to one of the terminals of the RA circuit's 102 differential output. Moreover, based on a switching behavior of the bit switches $S_{10}$, $S_{11}$, $S_{12}$, and $S_{13}$, bp's of the capacitors in the first capacitor array 427 may be connected to a high voltage node or a low voltage node provided by the reference voltage nodes 441/443. Furthermore, the reference node 443 may also provide scaled versions (½, ¼, ⅛, etc.) of the reference voltages (e.g., low and high reference voltages) provided by the reference node 441.

Similarly, the tp's of the capacitors in the second capacitor array 429 are each coupled to an inverting input terminal of the comparator 431, and also to the common voltage 437' (e.g., $V_{CM}$) through the switch 439' (when the switch 439' is turned on during phase $\Phi_3$); and the bp's of the capacitors in the second capacitor array 429 are each selectively coupled to either a node 435' or a nodes 441'/443' based on a switching behavior of the respectively coupled bit switch ($S_{14}$, $S_{15}$, $S_{16}$, and $S_{17}$). Further, in some embodiments, the node 435' is coupled to one of the terminals of the RA circuit's 102 differential output. Moreover, based on a switching behavior of the bit switches $S_{14}$, $S_{15}$, $S_{16}$, and $S_{17}$, bp's of the capacitors in the first capacitor array 429 may be connected to a high voltage node or a low voltage node provided by the reference voltage nodes 441'/443'. Furthermore, the reference node 443' may also provide scaled versions (½, ¼, ⅛, etc.) of the reference voltages (e.g., low and high reference voltages) provided by the reference node 441'.

In some embodiments, capacitances of the capacitors in the first capacitor array 427 are weighted with respect to one another. For example, if the minimum capacitance is C then the capacitors in the first capacitor array 427 may have capacitance of 2×C, 4×C, 8×C, 16×C. In further embodiments, a respective capacitance of each additional capacitor the first capacitor array 427 may be selected as: 2N×C, wherein N is an integer larger than 3. Capacitances of the capacitors in the second capacitor array 429 may be selected in similar fashion. In some embodiments, the total capacitance in the first capacitor array 427 (or the second capacitor array 429) is about 55 femtofarad (fF), which provides low thermal noise.

In some embodiments, the switching behavior of each of the bit switches ($S_{10}$, $S_{11}$, $S_{12}$, $S_{13}$, $S_{14}$, $S_{15}$, $S_{16}$, $S_{17}$) is controlled by the SAR logic 433. In some embodiments, the SAR logic 433 is configured to sequentially provide a plurality of control signals controlling bit switches $S_{10}$, $S_{11}$, $S_{12}$, $S_{13}$, $S_{14}$, $S_{15}$, $S_{16}$, $S_{17}$ based on a plurality of sequentially provided comparison results that are output by the comparator 431. In some embodiments, the sequential control signals of the SAR logic 433 may be provided based on a clock signal received by the SAR logic 433.

In some embodiments, the comparator 433 may be configured to compare voltage levels at its two input terminals after the control signals generated by the SAR logic 433 are used for toggling the respective bit switches ($S_{10}$, $S_{11}$, $S_{12}$, $S_{13}$, $S_{14}$, $S_{15}$, $S_{16}$, $S_{17}$). In some embodiments, the comparator 433 is configured to convert the amplified residual voltage signal received from the RA circuit 104 into the digital signal 107 that corresponds to a least-significant-bits (LSB) portion of the digital output signal 103.

Figure 5:
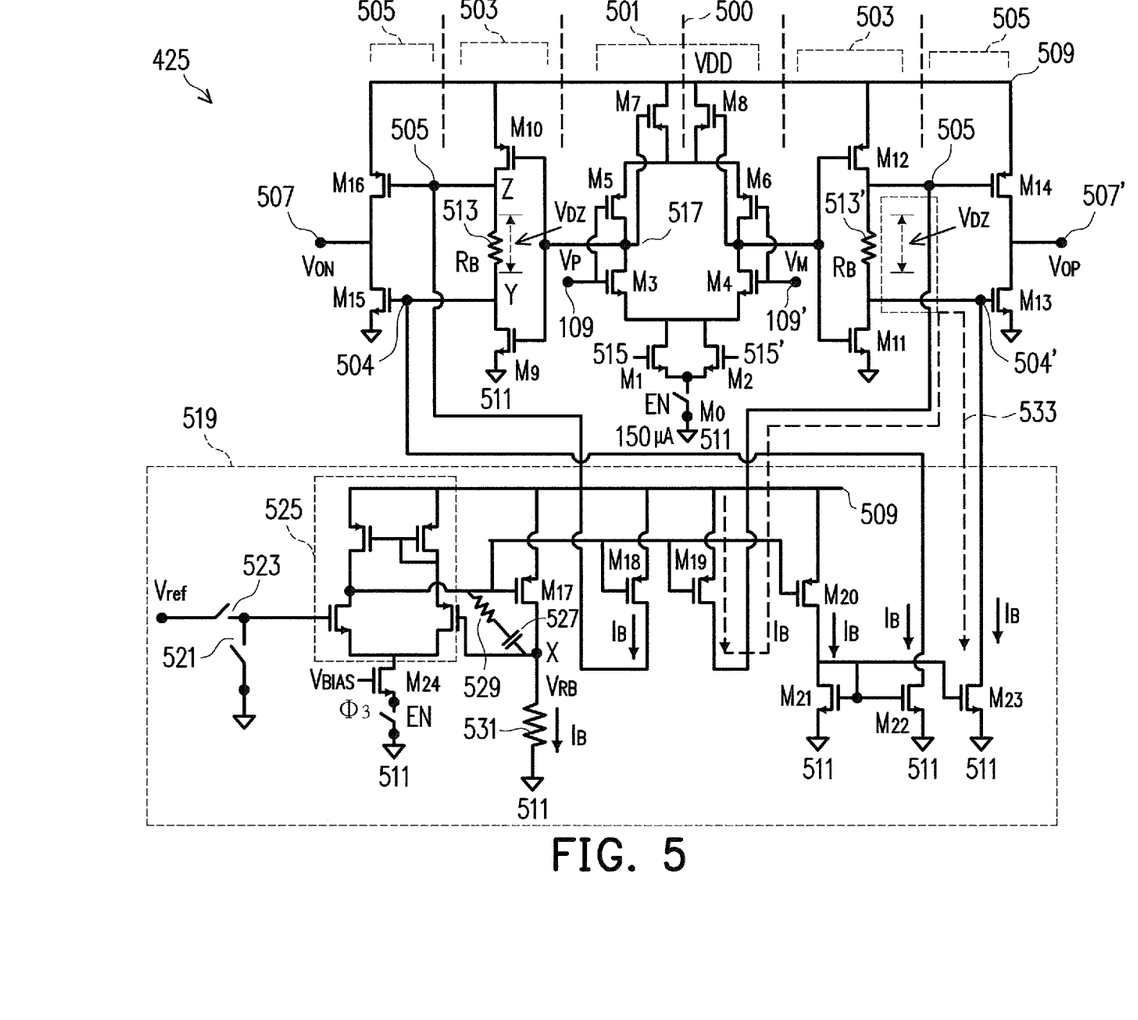
FIG. 5 illustrates an exemplary circuit diagram of an amplifier within the RA circuit, in accordance with some embodiments.

FIG. 5 illustrates an exemplary circuit diagram of the amplifier 425 in the RA circuit 104, in accordance with some embodiments of the present disclosure. In some embodiments, the amplifier 425 may be implemented as a differential circuit. Accordingly, the amplifier 425 is symmetric with respect to line 500, as shown in FIG. 5. It is noted that the amplifier 425 may be alternatively implemented as a single-ended amplifier while remaining within the scope of the present disclosure. In some embodiments, the amplifier 425 includes three uncompensated inverter stages: 501, 503, and 505 that are configured to receive, during phase $\Phi_3$, and amplify the differential residual signals 109 and 109'. More specifically, the first stage 501 is configured to receive the differential residual signals 109 and 109' (e.g., $V_P$ and $V_M$), the second stage 503 is configured to receive and process signals from the respective sides of the first stage 501, and the third stage 505 is configured to receive and process signals from the respective sides of the second stage 503. In some embodiments, the third stage 505 may employ a deadzone (e.g., voltage drop $V_{DZ}$ on resistors 513/513') to provide closed loop stability when the amplifier's 425 input 109/109' approaches the desired common-mode voltage (e.g., $V_{CMI}$ or $V_{CMO}$) by operating the third stage 505 in a deep sub-threshold region, thereby providing a high output resistance that forms a dominant pole for the stable feedback operation of the amplifier 425.

In some embodiments, the first stage 501 comprises of transistors M0, M1, M2, M3, M4 M5 M6 M7 and M8. The second stage 503 comprises of transistors M9, M10, M11, M12 and the two resistors 513/513' coupled between the transistors (M9 and M10) and (M11 and M12), respectively and configured to dynamically apply offset voltages to the third stage 505 so as to operate the third stage 505 in deep-sub-threshold region during the steady state operation. The third stage 505 includes transistors M13, M14, M15, and M16 and is further configured to operate in sub-threshold region, while exhibiting a high output resistance that forms a dominant pole needed for a stable feedback loop. In some embodiments, the transistors M0, M1, M2, M3, M4, M9, M11, M13, and M15 each includes an NMOS transistor, and M5, M6, M7, M8, M10, M12, M14, and M16 each includes a PMOS transistor. Although the illustrated embodiments of FIG. 3 shows that M0-M16 are either NMOS or PMOS transistors, any of a variety of transistors or devices that are suitable for use in a memory device may be implemented as at least one of M0-M16 such as, for example, a bipolar junction transistor (BJT), a high-electron-mobility transistor (HEMT), etc.

In some embodiments, the transistor M0 is gated by an enable signal EN that can used to enable or disable the amplifier 425. In some embodiments, the enable signal EN may be derived from the signal $\Phi_1$. In further embodiments, the transistor M0 may be coupled to a reference voltage 511 (e.g. ground) at its source; the transistors M1 and M2 are gated by bias signals 515 ($V_{BIAS}$) and 515' ($V_{CMFB}$) and coupled to the transistor M0 at the transistor M0's drain and M1's and M2's sources.

Since the amplifier 425 is symmetric with respect to the line 500, for brevity, the following discussion of the amplifier 425 will be focused on the left side of the line 500. In some embodiments, transistors M3 and M5 are formed as a first inverter, between $V_{DD}$ 509 and the drain of the transistor M1, that receives one of the differential residual signal 109 as an input signal; the transistor M7 is coupled to a reference voltage 509 (e.g., $V_{DD}$) at its source, and the transistor M7's gate is coupled to a common node 517 coupled to the transistor M3's and M5's respective drains. In the second stage 503, the transistors M9 and M10 are coupled to the common node 517 at their respective gates, and the transistors M9 and M10 are formed as a second inverter, between the reference voltage 509 and ground 511; and the resistor 313 is coupled between the transistors M9 and M10 at their respective drains. In the third stage 505, the transistors M15 and M16 are formed as a third inverter between the reference voltage 509 and ground 511, wherein the transistor M15's gate is coupled to a node Y and the transistor M16's gate is coupled to a node Z. In some embodiments, the third inverter of the third stage 505 may be configured to output signal 507 (e.g., $V_{ON}$) that is an amplified version of the signal 109. In some embodiments, the amplified output signal 507 may correspond to an out-of-phase signal of the amplified residual voltage signal 113 (FIG. 1).

On the right side of the line 500, the transistors M0, M2, M4, M6, M8, M11, M12, M13, and M14, the resistor 513' are laid out substantially similar to the components on the left side except that an inverter formed by the transistors M4 and M6 receives the other of the differential residual signal 109' as its input signal, and another inverter formed by the transistors M13 and M14 is configured to output signal 507' that is an amplified version of the signal 109'.

It is also noted a pair of current sources may be incorporated between the second and third stages 503 and 505, wherein one of the pair of the current sources may be configured to carry a current $I_B$ between the reference voltage $V_{DD}$ 509 and the node "Z," and the other of the pair of the current sources may be configured to carry a current $I_B$ between the node "Y" and ground 511. In some embodiments the current sources may be incorporated in a deadzone control circuit 519 that includes one or more circuits each configured to provide the current $I_B$ between the reference voltage $V_{DD}$ 509 and the node "Z" and the node "Y" and ground 511 as well as a deadzone control for a stable feedback operation of the amplifier 425 in various semiconductor process variation corners and supply voltages. The deadzone control circuit will be discussed in further detail below.

Figure 6:
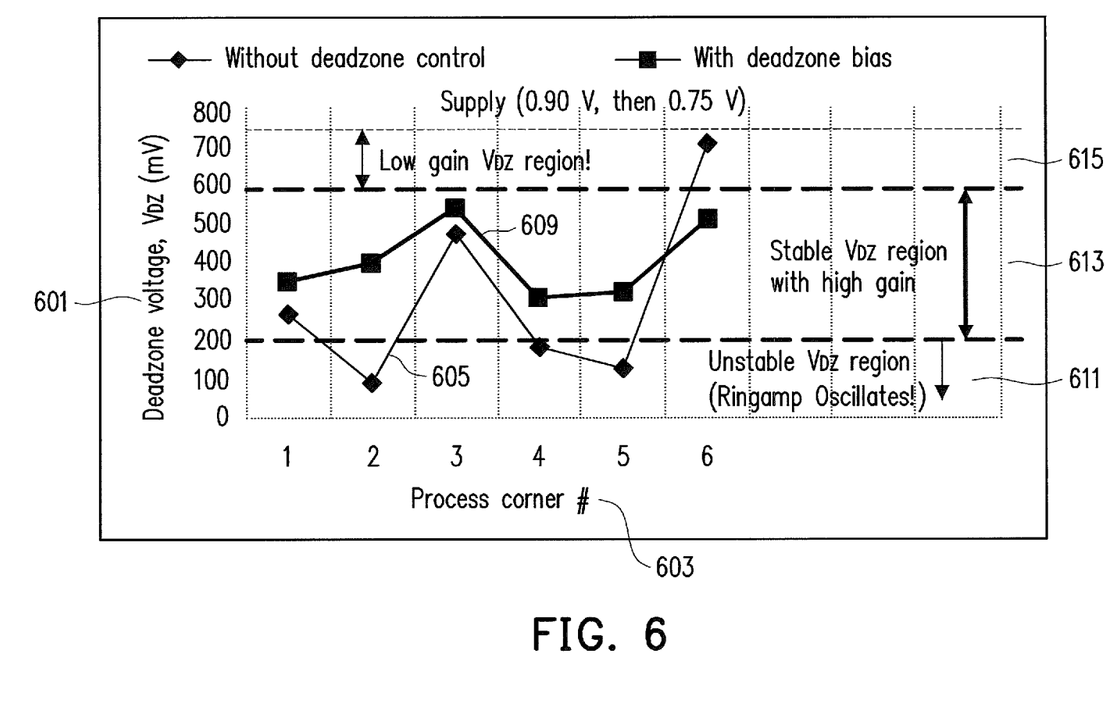
FIG. 6 shows variations of a deadzone voltage across a resistor with respect to the six front end of line (FEOL) process corners at reference supply voltages 0.90 V and 0.75 V.

In semiconductor manufacturing, variations in fabrication parameters may vary the characteristics of the integrated circuits fabricated on semiconductor wafers. As such, the variations in fabrications parameters may cause feedback compensated amplifiers to oscillate or exhibit instability in operation in response to varying environmental conditions, such as high/low voltage supply, high/low clock frequency, and high/low temperature. In this regard, FIG. 6 shows variations of a deadzone voltage $V_{DZ}$ 601 across the resistor 513 or 513' with respect to the six front end of line (FEOL) process corners 603 (typical-typical (TT), fast-fast (FF), and slow-slow (SS)) at the reference voltage $V_{DD}$ 509 set to 0.90 V or to 0.75 V. Table 2 below lists six FEOL process corners at the reference supply voltage $V_{DD}$ 509 set to 0.90 V and to 0.75 V.

TABLE 2

| Corner # | 1 | 2 | 3 | 4 | 5 | 6 |
|---|---|---|---|---|---|---|
| Process | tt | ss | ff | tt | ss | ff |
| Supply, V | 0.90 | 0.90 | 0.90 | 0.75 | 0.75 | 0.75 |

As illustrated by a curve 605 of FIG. 6, the deadzone voltage $V_{DZ}$ 601 across the resistor 513 or 513' in the absence of the deadzone control circuit 519 enters into unstable region 611 at the process corners 2, 4 and 5 and stays within the stable region 613 at the process corners 1 and 3. At the process corner 1, where the process is "tt" and the amplifier's 425 supply voltage $V_{DD}$ 509 is set to 0.9 V, the deadzone voltage $V_{DZ}$, based on the simulated curve 605, may be 270 mV. Yet, the deadzone voltage $V_{DZ}$ of 270 mV does not provide enough voltage margin for safely operating the third inverter stage 505 in deep sub-threshold region, which, in turn, provides a high output resistance that forms a dominant pole for a stable feedback operation of the amplifier 425 as it approaches a steady state mode. Moreover, as further shown by the curve 605, at the process corner 1, where the process is "tt" and the amplifier's 425 supply voltage $V_{DD}$ 509 is set to 0.75 V, the deadzone voltage $V_{DZ}$, drops to 150 mV, which is outside the stable region 613, causing oscillations due to insufficient deadzone induced instability. Furthermore, as shown by the curve 605, at the process corner 6, the deadzone voltage $V_{DZ}$ may be greater than 550 mV, and the amplifier 425 may operate in an undesired low gain region 615 as the transistors (M9, M10, M11 and M12) of the second stage 503 enter the linear operating region. Thus, as illustrated in FIG. 6, the allowable range for the deadzone voltage $V_{DZ}$ variations become increasingly constrained at the lowered reference supply voltage $V_{DD}$ 509, or else, the amplifier 425 may either becomes unstable (region 611), enter the undesired low gain region 615, or even become non-functional. On the other hand, a curve 609 shows the deadzone voltage $V_{DZ}$ 601 across the resistor 513 or 513' in the deadzone control circuit 519 enabled. As illustrated by the curve 609 of FIG. 6, the deadzone voltage $V_{DZ}$ stays within the stable region 613 for all simulated process corners (e.g., process corners 1 to 6 of Table 2).

Refereeing again to FIG. 5, the deadzone control circuit 519 may include transistors M17, M18, M19, M20, M21, M22, M23, and M24, a differential amplifier with an active load 525, a resistor 531, and a feedback capacitor 527 and a resistor 529 connected in series. In some embodiments, the active load of the differential amplifier may be a current mirror. In some embodiments, the transistors M21, M22, and M23 may be NMOS transistors and M17, M20, M21, and M22 may be PMOS transistors. In further embodiments, the transistors M17, M18, M19, M20, M21, M22, and M23 may also be implemented as bipolar junction transistors (BJT) or as high-electron-mobility transistors (HEMT). In some embodiments, the transistors M18 and M19 may form a compact (e.g., small area footprint) input pair configured to generate the current $I_B$ between the reference voltage $V_{DD}$ 509 and the node "Z" and between the nodes "Y" and ground 511. In some embodiments, drains of the transistors M18 and M19 may be coupled to nodes 505 and 505', respectively and sources the transistors M18 and M19 may be coupled to the reference voltage $V_{DD}$ 509. Moreover, the input pairs formed by the transistors M18 and M19 may also provide a gate voltage to the M17 PMOS transistor, by coupling the gates of the transistors M18 and M19 to the gate of the transistor M17, so as to generate the same the current $I_B$ from the reference voltage $V_{DD}$ node 509 through the transistor M17 to ground 511. In some embodiments, the transistor M20's source may be coupled to the reference voltage $V_{DD}$ node 509, the transistor M20's gate may also be coupled to the gates of transistors M17, M18, and M19, and the transistor M20' drain may be commonly coupled to the drain and the gate of the transistor M21 and gates of the transistors M22-M23. The transistors M21-M23 may be coupled to ground 511 at their respective sources. Moreover, in some embodiments, drains of the transistors M22 and M23 may be coupled to nodes 504 and 504', respectively.

In some embodiments, a resistance value of the resistor 531 coupled between the drain of the transistor M17 and ground 511 may be substantially identical to a resistance value of the resistor $R_B$ 513/513'. Moreover, the differential amplifier with current mirror load 525, in some embodiments, may be biased with the transistor M24 having its gate set to a bias voltage reference $V_{BIAS}$. In some embodiments, the deadzone control circuit 519 may be enabled or disabled through a switch EN coupled to the source of the bias transistor M24 and controlled by the signal $\Phi_3$. Furthermore, during the test mode, one of the inputs of the differential amplifier with current mirror load 525 may be set to ground through a switch 521. In some embodiments, the output of the differential amplifier 525 may be coupled to one of its input at node X through a passive feedback filter comprised of the capacitor 527 in series with the resistor 528. In further embodiments, the differential amplifier with current mirror load 525 may be coupled to a reference voltage $V_{RB}$ at one of its inputs through a switch 523. In a steady-state, when the switch 523 is turned on, the gate voltage of the PMOS transistor M17 that results in a voltage drop of $V_{RB}$ across the resistor 531, which yields a current, $I_B=V_{RB}/R_B$. In some embodiments, the gate voltage of the PMOS transistor M17 may be set by a reference voltage $V_{ref}$ at one of inputs of the differential amplifier with current mirror load 525. In further embodiments, the current $I_B$ that flows through the resistor 531 may then be mirrored to the matched deadzone resistor $R_B$ 513/513' in the second stage 503 of the amplifier 425, resulting in a stable (i.e., process and temperature independent) voltage drop of $V_{RB}$, which can be based on a bandgap reference. As such, the deadzone voltage $V_{DZ}$ generated across the resistor $R_B$ 513/513' in the second stage 503 is the sum of the voltage $V_{RB}$ and the voltage drop generated by the inverter short circuit current. The deadzone voltage $V_{DZ}$ may be expressed as follows:

$$V_{DZ} = V_{RB} + \frac{1}{2}\mu C_{ox} \frac{W}{L}(V_{GS} - V_{TH})^2 R_B \qquad (1)$$

In equation (1), the deadzone voltage $V_{DZ}$ is a sum of the voltage $V_{RB}$ that is stable over process, voltage, and temperature (PVT) variations, etc. and the second term that is the voltage drop formed by the (long channel) saturation region transistor current through the resistor 513/513' $R_B$. In this regard, design choices for the voltage $V_{RB}$, the resistors 531 and 513/513' and the sizing (e.g., W/L) of the M11 and M12 (M10 and M9) transistors of the second stage 503 may result in the deadzone voltage $V_{DZ}$ variations that are within the stable region 613 (FIG. 6).

In some embodiments, transient response characteristics of the deadzone control voltage $V_{DZ}$ during the amplification phase $\Phi_3$ may be designed such that a coarse as well as fine amplification is accomplished. That is, during the initial moments of the amplification phase $\Phi_3$, the deadzone control voltage $V_{DZ}$ may bias the transistors M13 and M14 (M15 and M16) of the third stage 505 of amplifier 425 in a high bandwidth and low gain state, which provides an initial fast and coarse slew charge at the output node 507/507'. Subsequently, the transistors M13 and M14 (M15 and M16) of the third stage 505 may then gradually converge towards a lower bandwidth and higher gain state for finer settling. In some embodiments, a deadzone current path 533 may be designed to be independent of the amplifier's 425 differential signal path.

In one exemplary advantage of the amplifier 425 shown in FIG. 5 is that it produces a high gain by utilizing three cascaded gain stages 501, 503, and 505. Another exemplary advantage of the amplifier 425 is that it provides near rail-to-rail swing for the output differential signals $V_{ON}$ and $V_{OP}$. Other advantages of the amplifier 425 are the ability to operate in a low voltage supply domain and to scale with advancing process technology, which provides an improved performance.

Figure 7:
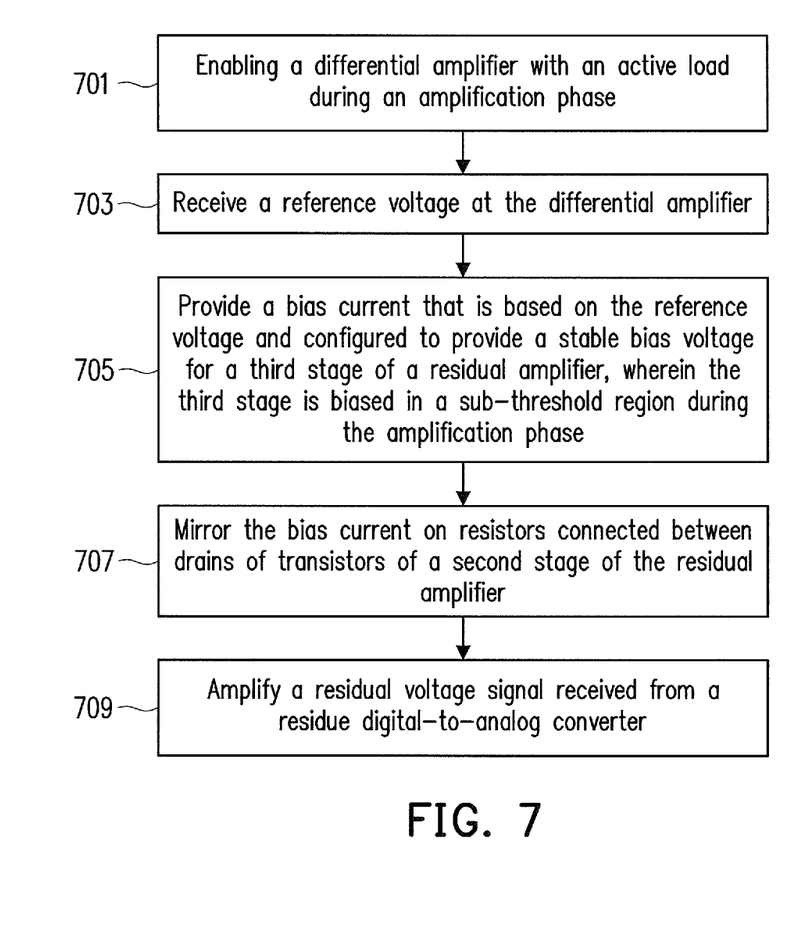
FIG. 7 illustrates an exemplary flow chart of a method performing a residue amplification with the amplifier that has an output stage is biased in a stable sub-threshold region, in accordance with some embodiments.

FIG. 7 illustrates an exemplary flow chart of a method for performing a residue amplification with an amplifier that has an output stage is biased in a stable sub-threshold region, in accordance with some embodiments. The method shown in FIG. 7 is merely an example. Therefore, it should be understood that any of a variety of operations may be omitted, re-sequenced, and/or added while remaining within the scope of the present disclosure. In accordance with some embodiments, the operations of the method illustrated in FIG. 7 can be performed by the amplifier 425 of FIG. 5, the RA circuit 104 of FIG. 1, 2 or 4. For ease of discussion, the following embodiment of the method illustrated in FIG. 7 will be described using the amplifier 425 of FIG. 5 as a representative example.

The method for performing a residue amplification starts with operation 701 in which the differential amplifier with a current mirror load 525 is turn on through the switch EN during the amplification phase $\Phi_3$, in accordance with some embodiments.

After the turning the differential amplifier 525 on, the method shown in FIG. 7 proceeds to operation 703, which includes receiving the reference voltage $V_{ref}$ at one of the inputs of the differential amplifier 525. In some embodiments, the reference voltage $V_{ref}$ is used to establish a current $I_B$ through the resistor 531. In some embodiments, the voltage drop $V_{RB}$ formed across the resistor 531 due to the current $I_B$ may be substantially same as the received reference voltage $V_{ref}$.

The method for performing a residue amplification continues to operation 705 in which a bias current is based on the reference voltage $V_{ref}$ and configured to provide a stable bias voltage to an output stage 505 of the amplifier 425, where the output stage 505 is biased in a sub-threshold region during the amplification phase $\Phi_3$. In some embodiments, the bias voltage for the output stage 505 of the amplifier is based on the deadzone voltage $V_{DZ}$ formed across the deadzone resistor $R_B$ 513/513' due to the current $I_B$. In some embodiments, the deadzone voltage $V_{DZ}$ formed across the deadzone resistor $R_B$ 513/513', due to $I_B R_B$ voltage drop and the inverter short circuit current, is stable across process, voltage, and temperature variations.

At operation 707, the current $I_B$ that flows through the resistor 531 may be mirrored on the deadzone resistor $R_B$ 513/513', in accordance with some embodiments. In further embodiments, the current $I_B$ that flows through the resistor 531 may be mirrored through current mirrors connected in series and comprised of NMOS transistors M21, M22, and M23 (FIG. 5) and PMOS transistors M17, M18, M19, and M20 (FIG. 5).

At operation 709, the residual voltage signal 109/109' received from the RDAC 203 (FIG. 4) may amplified by the amplifier 425 (FIG. 5), in accordance with some embodiments. The operation 709 may correspond to phase $\Phi_3$ of the first iteration with respect to Table 1. As such, in phase $\Phi_3$ of the first iteration, the RDAC 203 (FIG. 4) of the first SAR circuit 102 may be configured to hold the residual voltage signal 109/109' and the RA circuit 104 may be configured to amplify the residual voltage signal 109/109' by using the amplifier 425 comprising of three state inverters, so as to provide the amplified residual signal 113 for the second SAR circuit 106.

While various embodiments of the present disclosure have been described above, it should be understood that they have been presented by way of example only, and not by way of limitation. Likewise, the various diagrams may depict an example architectural or configuration, which are provided to enable persons of ordinary skill in the art to understand exemplary features and functions of the present disclosure. Such persons would understand, however, that the present disclosure is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations are used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques.

To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure. In accordance with various embodiments, a processor, device, component, circuit, structure, machine, module, etc. can be configured to perform one or more of the functions described herein. The term "configured to" or "configured for" as used herein with respect to a specified operation or function refers to a processor, device, component, circuit, structure, machine, module, signal, etc. that is physically constructed, programmed, arranged and/or formatted to perform the specified operation or function.

Furthermore, a person of ordinary skill in the art would understand that various illustrative logical blocks, modules, devices, components and circuits described herein can be implemented within or performed by an integrated circuit (IC) that can include a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A processor programmed to perform the functions herein will become a specially programmed, or special-purpose processor, and can be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the present disclosure.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. A physical unclonable function (PUF) generator comprising:
    a plurality of PUF cells, wherein each of the plurality of PUF cells comprises a plurality of transistors;
    a plurality of circuits wherein each of the plurality of circuits is coupled to each of the plurality of PUF cells respectively, wherein the plurality of circuits each is configured to monitoring a voltage level on a node on each of the plurality of PUF cells;
    a population count circuit coupled to the plurality of circuits, wherein the population count circuit is configured to determine a first number of PUF cells having flipped logical states from a first logical state to a second logical state; and
    an evaluation logic circuit having an input coupled to the population count circuit and an output coupled to the plurality of circuits, wherein the evaluation logic circuit is configured to compare the first number with a predetermined number of PUF cells, wherein a PUF signature is generated when the number of PUF cells that are at the second logical state are equal to or higher than the predetermined number of PUF cells.

2. The PUF generator of claim 1, wherein the plurality of transistors each comprise an n-type MOS (NMOS) transistor.

3. The PUF generator of claim 1, wherein the plurality of transistors comprises:
    a first MOS transistor and a second MOS transistor, wherein a source of the first MOS transistor is connected to a drain of the second MOS transistor at a dynamic node, a drain of the first MOS transistor is coupled to a first bus and a gate of the first MOS transistor is coupled to a second bus, and a source and a gate of the second MOS transistor are coupled to ground, and
    wherein the second bus is coupled to a high voltage level at a first time so as to charge the dynamic node to a first voltage that is different from a voltage on the first bus.

4. The PUF generator of claim 3, wherein the second bus is coupled to a low voltage level at a second time so as to discharge the dynamic node to a second voltage at a third time through the second MOS transistor.

5. The PUF generator of claim 4, wherein the plurality of circuits is configured to determine when the dynamic nodes of respective PUF cells flip from the first logical state to the second logical state.

6. The PUF generator of claim 4, wherein the plurality of circuits configures a plurality of third voltages.

7. The PUF generator of claim 6, wherein the flip from the first logical state to the second logical state is determined when the second voltage at the third time on the dynamic node of the PUF cell becomes lower than the third voltage of the corresponding circuit.

8. The PUF generator of claim 1, wherein the population count circuit is configured to detect a number of PUF cells that are at the second logical state.

9. The PUF generator of claim 1, wherein the predetermined number is equal to half a total number of PUF cells in the PUF generator.

10. The PUF generator of claim 1, wherein the PUF signature is a multi-bit binary sequence comprising a combination of logical states of each of the plurality of PUF cells in the PUF generator.

11. A method to configure a physical unclonable function (PUF) generator for generating a PUF signature, the method comprising:
 coupling a plurality of PUF cells to a plurality of circuits, wherein each of the plurality of PUF cells comprises a first transistor and a second transistor;
 charging a plurality of dynamic nodes in the plurality of PUF cells to a plurality of first voltages through each of the plurality of first transistors;
 discharging the plurality of dynamic nodes to a plurality of second voltages through each of the plurality of second transistors;
 monitoring each of the plurality of second voltages using corresponding circuits;
 flipping logical states of the plurality of PUF cells from a first logical state to a second logical state when the second voltage becomes smaller than a third voltage; and
 generating a PUF signature when a number of PUF cells having flipped logical states are more than a predetermined number of PUF cells.

12. The method of claim 11, wherein the first transistor is configured having a source terminal coupled to a drain terminal of the second transistor at the dynamic node, a drain coupled to a first bus, and a gate terminal coupled to a second bus.

13. The method of claim 11, wherein the second transistor is configured having a source and a gate terminal coupled to ground.

14. The method of claim 11, wherein the first and second transistors each comprise a NMOS transistor.

15. The method of claim 11, wherein the first voltages on the dynamic nodes of corresponding PUF cells is determined by threshold voltages of the first transistors of corresponding PUF cells.

16. The method of claim 11, wherein a time required for the dynamic nodes to discharge to the second voltages is determined by current leakage through the second transistors of corresponding PUF cells.

17. The method of claim 11, wherein the third voltage is determined by the corresponding circuits.

18. A physical unclonable function (PUF) generator comprising:
 a plurality of PUF cells;
 at least one circuit coupled to each of the plurality of PUF cells, wherein the at least one circuit is configured to monitor a voltage level on a node of each of the plurality of PUF cells;
 a population count circuit coupled to the at least one circuit, wherein the population count circuit is configured to determine a first number of PUF cells having flipped logical states from a first logical state to a second logical state; and
 an evaluation logic circuit coupled to the population count circuit and the at least one circuit, wherein the evaluation logic circuit is configured to compare the first number with a predetermined number of PUF cells, wherein a PUF signature is generated when the number of PUF cells that are at the second logical state are equal to or higher than the predetermined number of PUF cells.

19. The PUF generator of claim 18, wherein the population count circuit is configured to detect a number of PUF cells that are at the second logical state.

20. The PUF generator of claim 18, wherein the predetermined number is equal to half a total number of PUF cells in the PUF generator.

* * * * *